United States Patent [19]

Nakauchi et al.

[11] 4,300,138

[45] Nov. 10, 1981

[54] ELECTRIC MEMORY DETECTOR IN AN ECD DRIVER

[75] Inventors: Hiroshi Nakauchi, Nara; Katubumi Koyanagi, Tenri; Hiroaki Kato, Tenri; Yutaka Takafuji, Tenri; Yasuhiko Inami, Tenri; Hisashi Uede, Yamatokoriyama, all of Japan

[73] Assignee: Sharp Kabushiki Kaisha, Osaka, Japan

[21] Appl. No.: 92,672

[22] Filed: Nov. 9, 1979

Related U.S. Application Data

[63] Continuation of Ser. No. 859,757, Dec. 12, 1977, abandoned.

[30] Foreign Application Priority Data

Dec. 17, 1976 [JP] Japan ............................. 51-154768
Feb. 25, 1977 [JP] Japan ............................. 52-20494

[51] Int. Cl.³ .......................... G09F 7/32; G06F 3/14
[52] U.S. Cl. ................................. 340/785; 340/763; 340/811; 350/357
[58] Field of Search .................... 340/785, 763, 811; 350/357

[56] References Cited

U.S. PATENT DOCUMENTS

| | | | |
|---|---|---|---|
| 3,096,271 | 7/1963 | Hespenheide | 340/785 |
| 3,736,043 | 5/1973 | Sambucetti | 340/785 |
| 3,950,077 | 4/1976 | Jasinski | 340/785 |
| 3,961,842 | 6/1976 | Jasinski | 340/785 |
| 3,972,040 | 7/1976 | Hilsum et al. | 340/785 |
| 4,057,739 | 11/1977 | Otake | 350/357 |

OTHER PUBLICATIONS

*Information Displays: Innovation is the Rule,* Jurgen, IEEE Spectrum, p. 18, 11/72.

*Primary Examiner*—Marshall M. Curtis
*Attorney, Agent, or Firm*—Birch, Stewart, Kolasch and Birch

[57] ABSTRACT

In an electrochromic display comprising a back plate electrode, a plurality of display electrodes, and a reference electrode available for maintaining the potential of the respective display electrodes at a fixed value, there is provided a detector for sensing the counter electromotive force which is developed between the display electrodes and the reference electrode in a manner such that there is created a remarkable difference in the output voltage signal thereof between in the colored state and in the bleached state. Therefore, the output signal from the detector indicates whether the electrochromic display is held in the colored state or the bleached state.

3 Claims, 17 Drawing Figures counter electromotive force (Volt)

ELECTRIC MEMORY DETECTOR IN AN ECD DRIVER

This application is a continuation, of copending application Ser. No. 859,757, filed on Dec. 12, 1977 now abandoned.

BACKGROUND OF THE INVENTION

The present invention relates to a drive system for an electrochromic display containing an electrochromic material held in contact with two electrode carrying support plates, at least one of which is transparent, to manifest reversible variations in the light absorption properties upon current being supplied thereto.

A display containing electrochromic material (referred to as "ECD" hereinbelow) will be summarized in the following paragraph. There are two types of the electrochromic display. See, for example, L. A. Goodman, "Passive Liquid Displays," RCA Report 613258. The first type of ECD includes an inorganic solid film formed on electrodes, which produces color variations by the change in the opacity. The second type of ECD utilizes an electrically induced chemical reduction of a colorless liquid to produce a colored, insoluble film on a cathode surface.

In such ECDs, memory effects are expected, which maintains the coloration state or the bleached state for several hours through several days as long as ECDs are held in an electrically opened state. If electric signals are available indicating whether an ECD is maintained in the coloration state or the bleached state, they would be useful for further utilization such as further data processing.

SUMMARY OF THE INVENTION

Accordingly, the present invention meets the requirement noted above with the prior art by providing an ECD driver of this invention.

An ECD used with the present invention comprises a back plate electrode, at least one electrode and a reference electrode available for maintaining the respective display electrodes at a constant potential. The ECD further contains an electrochromic material held in contact with electrode support plates, at least one of which is transparent, to manifest reversible variations in the light absorption properties upon current being supplied. A detector is provided for sensing the counter electromotive force developed between the display electrode and the reference electrode and then producing two different voltage signals indicative of the coloration state or the bleached state, whereby the electric memory state of the ECD is read out. In the case where the ECD has seven segmented display electrodes, for example, the ECD driver of the present invention can read out electric signals representing the coloration state and the bleached state of the respective segmented electrodes. These electric signals are processed through the use of a well known data processor, for example, an encoder adapted to convert seven segment signals into binary signals. In another aspect of the present invention, an ECD comprises a back plate electrode, a predetermined number of display electrodes and a reference electrode available for measuring the counter electromotive force at the display electrode side. There is provided an accumulator/counter for counting the electric signals and providing the counts thereof for the ECD, and detectors connected between the respective display electrodes and the reference electrode for measuring the electric memory state of the ECD which has been developed as counter electromotive force. A comparator detects the coincidence between the output of the detector and the output of the accumulator/counter. If there is coincidence, then the electric memory state of the ECD is loaded as an initial value into the accumulator/counter. The ECD and the accumulator/counter, therefore, are ready for forthcoming electric signals. This is applicable to the traveling distance meter of a vehicle.

BRIEF DESCRIPTION OF THE DRAWINGS

Other objects and novel features of the present invention are set forth in the appended claims and the mode of operation will best be understood from a consideration of the following detailed description of the embodiments taken in conjunction with the accompanying drawings, wherein;

DETAILED DESCRIPTION OF THE INVENTION

Referring now in detail to the drawings, and to facilitate a more complete understanding of the present invention, basic structures of the ECD and the conventional driver circuit will be first described with reference to FIGS. 1 through 4.

Figure 1:
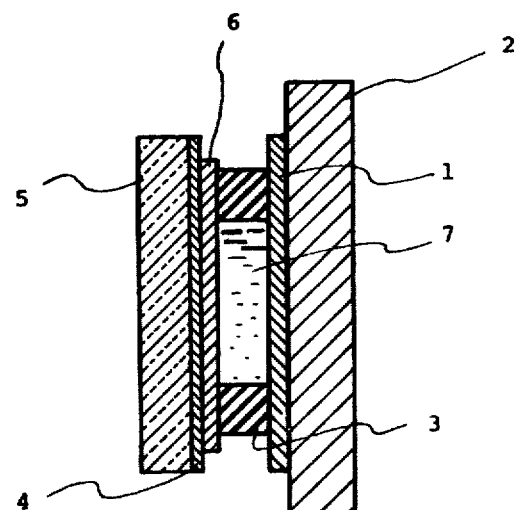
FIG. 1 is a cross sectional view of a scheme of a solid state ECD.

As stated above, there are two types of electrochromic displays referred to as ECDs. In one kind, the color variation is produced by the change in the opacity of an inorganic solid film. A typical device structure is shown in FIG. 1, wherein a layer of carbon powder added with binder (registered trademark AQUADAG) is denoted as 1, a stainless plate is denoted as 2. Both the layer 1 and the stainless plate 2 constitute a back plate electrode. A spacer is denoted as 3; a transparent electrode is denoted as 4; a glass substrate is denoted as 5; an inorganic solid film which manifests the electrochromic phenomenon is denoted as 6; and an electrolyte is denoted as 7.

The inorganic film 6 most commonly used for electrocoloration is $WO_3$ with thickness of about 1 $\mu m$. The electrolyte 7 is a mixture of sulfuric acid, an organic alcohol such as glycerol, and a fine white powder such as $TiO_2$. The alcohol is added to dilute the acid and the pigment is used to provide a white reflective background for the coloration phenomenon. The thickness of the liquid is usually about 1 mm. The back plate electrode is properly selected for effective operation of the device.

The amorphous $WO_3$ film is colored blue when the transparent electrode is made negative with respect to the back plate electrode. The applied voltage is several volts. The blue color is diminished or bleached when the polarity of the applied voltage is reversed. This is termed bleaching.

The coloration of the film is apparently produced by the injection of electrons and protons into the $WO_3$ film. Bleaching occurs because the electrons and protons are returned to their respective starting electrons when the polarity is reversed. The colored state can be maintained for several days after removal of the coloration voltage as long as the bleaching voltage is not applied (memory effects).

Figure 2:
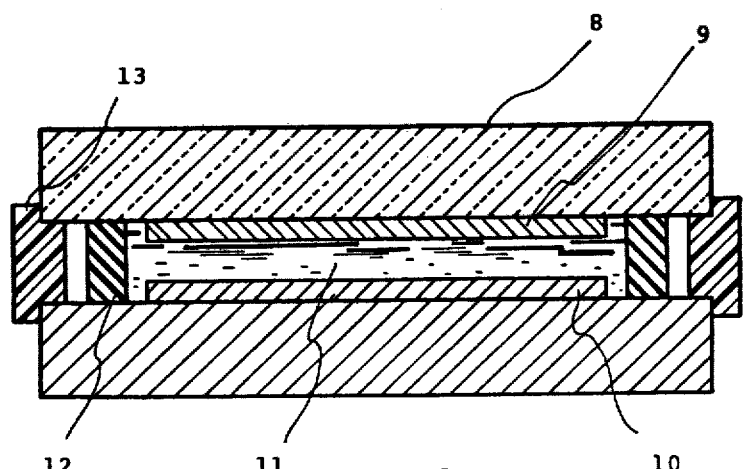
FIG. 2 is a cross sectional view of a scheme of a liquid state ECD.

The second type of ECD utilizes an electrically-induced chemical reduction of a colorless liquid to produce a colored, insoluble film on the cathode surface. In the absence of oxygen, the colored film remains unchanged as long as no current flows. However, the coloration will disappear gradually in the presence of oxygen. This is termed fading. Reversing the voltage causes the film to dissolve into the liquid with the concurrent erasure of the color. The colorless liquid that has met with the most success so far is an aqueous solution of the conducting salt, KBr, and an organic material, heptylviologen bromide, which is the material that produces a purplish film upon electrochemical reduction. Typical voltages are about 1.0 VDC. The basic cell structure is illustrated in FIG. 2. A glass substrate is denoted as 8; a back plate electrode is denoted as 9; display electrodes are denoted as 10; a viologen mixture liquid is denoted as 11; a spacer is denoted as 12; and a sealing material is denoted as 13. The fluid thickness is normally about 1 mm. The viologen-based ECDs can be used in a transmissive mode if both electrodes are transparent or in a reflective mode if a white reflective pigment is mixed in the clear electrochromic liquid.

Although the operating principle of ECDs has been discussed above, ECDs have the following characteristic features:

(1) the viewing angle is extremely wide;
(2) a plurality of colors are selectable;
(3) for a single cycle of coloration/bleaching the power dissipation is several through several tens mj/cm$^2$, and the total power dissipation is proportional to the number of the repetition cycle; and
(4) memory effects are expected, which maintains the coloration state for several hours through several days after the coloration voltage is removed as long as ECDs are held in an electrically opened state. Of course, the memory effects require no externally supplied power.

Figure 3:
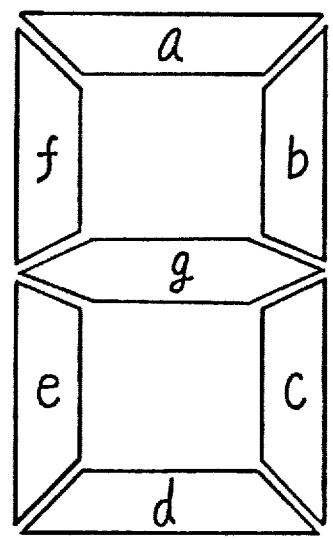
FIG. 3 is a layout of a typical seven-segment numeral display pattern.
Figure 4:
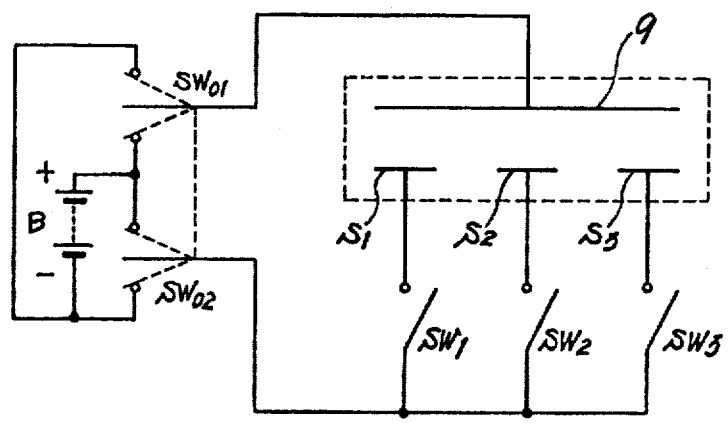
FIG. 4 is a circuit diagram of a typical driver for the ECD shown in FIG. 3.

By way of example, FIG. 4 illustrates a typical driver circuit for a seven-segment alphanumeric display utilizing the above constructed ECD of which the font is depicted in FIG. 3. Only three segments $S_1$, $S_2$ and $S_3$ are illustrated in FIG. 4 for convenience sake. The driver of FIG. 4 mainly comprises a power source B, polarity selection switches $SW_{01}$ and $SW_{02}$, the switches $SW_{01}$ and $SW_{02}$ being associated with each other, and segment switches $SW_1$, $SW_2$ and $SW_3$.

When only a specific segment $S_1$ is to be colored, the selection switches $SW_{01}$ and $SW_{02}$ are inclined toward the lower terminals, respectively, and only the segment switch $SW_1$ connected to the segment $S_1$ is closed. At this moment, the electric current flows from the back plate electrode 9 to the segment electrode $S_1$ through the electrolyte, thereby coloring the segment $S_1$.

Once the segment $S_1$ is sufficiently colored, at least one of the selection switches $SW_{01}$ and $SW_{02}$ is maintained at the intermediate position to terminate the flow of the electric current. The segment $S_1$ is sustained in the coloration state. Alternatively, the segment $S_1$ is also placed in the memory condition when the segment switch $SW_1$ is opened even when the selection switches $SW_{01}$ and $SW_{02}$ are inclined toward the lower terminals. The coloration tone can be controlled by selectively varying the ON period of the respective segment switches $SW_1$, $SW_2$ and $SW_3$.

Thereafter, when the segment $S_1$ is to be bleached, the selection switches $SW_{01}$ and $SW_{02}$ are inclined toward the upper terminals, respectively, and only the segment switch $SW_1$ connected to the segment $S_1$ is closed. At this moment, the electric current flows from the segment electrode $S_1$ to the counter electrode 9 through the electrolyte, thereby bleaching the semgent $S_1$. The degree of the bleaching is also controllable by varying the ON period of the segment switch $SW_1$.

Figure 5:
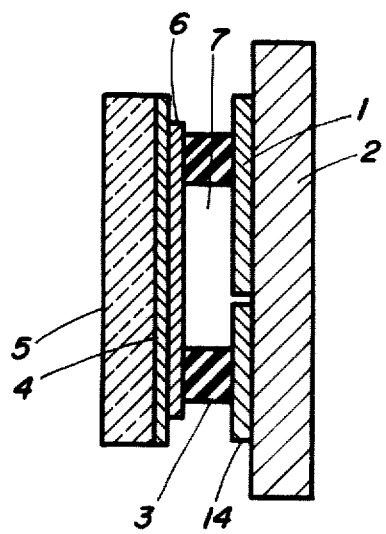
FIG. 5 is a cross sectional view of a solid state ECD provided with a reference electrode.
Figure 6:
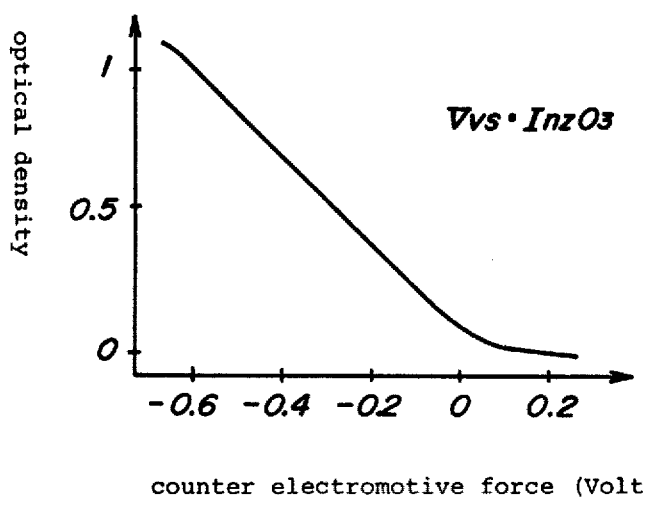
FIG. 6 is a graph plotting coloration density against memory voltage for a $WO_3$ ECD.

As already discussed above, ECDs show memory effects which require no externally supplied power. Another feature of ECDs resides in that they manifest electric memory effects in addition to the above discussed memory effects, that is, optical memory effects. The present invention utilizes these electric memory effects. These electric memory effects will be discussed briefly. The reason why the memory effects are expected only in the electrically open state is that a counter electromotive force occurs in coloring. For example, if a path between the segment electrode and the back plate electrode is shunted, such counter electromotive force will cause current to flow in the direction opposite to that in coloring thereby deteriorating the bleached state of the colored state. The experimental results of the counter electromotive force measured at the $WO_3$ film 6 of the cell construction of FIG. 5 are depicted in FIG. 6. In FIG. 5, there is shown a reference electrode 14 not pictured in FIG. 1 which is made of indium oxide ($In_2O_3$) used for the transparent electrode.

The necessity of the reference electrode 14 is justified by the following reasons. Generally, the electromotive force of a system comprising an electrolyte and an electrode is caused by the one electrode of a half battery comprising the electrolyte and the electrode. Electromotive force externally measured between two electrodes amounts to a total of that of two half-batteries. As already discussed, ECDs manifest electric memory effects. More exactly speaking, this implies that the electromotive force of a half battery consisting of the transparent electrode 4, the display electrode 6 of $WO_3$ and the electrolyte 7 is different when bleaching and when coloring the $WO_3$ film. A second half battery is needed to take out the electromotive force from that half battery and measure the variations in the electromotiveforce. Furthermore, the electromotive force of such a second half battery should be stable. Otherwise, variations in the electromotive force of the half battery at the display electrode side could not be measured correctly. The reference electrode 14 is provided for this reason and for measuring the counter electromotive force. A high input resistance voltage meter should be employed to prevent the electromotive force of the half battery at the reference electrode side from varying in response to current flowing through the reference electrode. Another possible approach is to measure the counter electromotive force between the back plate electrode and the display electrode. However, it seems considerably difficult because current flows through the back plate electrode in bleaching and in coloring the $WO_3$ film and the electromotive force of the half battery is not stable at the back plate electrode side. As a result, this approach is not preferable.

Figure 7:
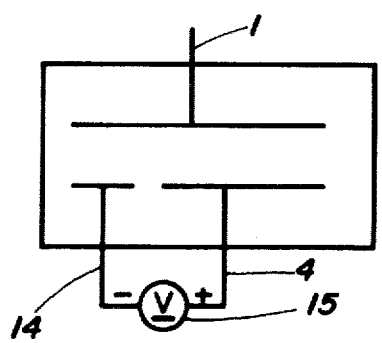
FIG. 7 is a diagram for measuring the coloration density VS. memory voltage characteristic shown in FIG. 6.
Figure 8:
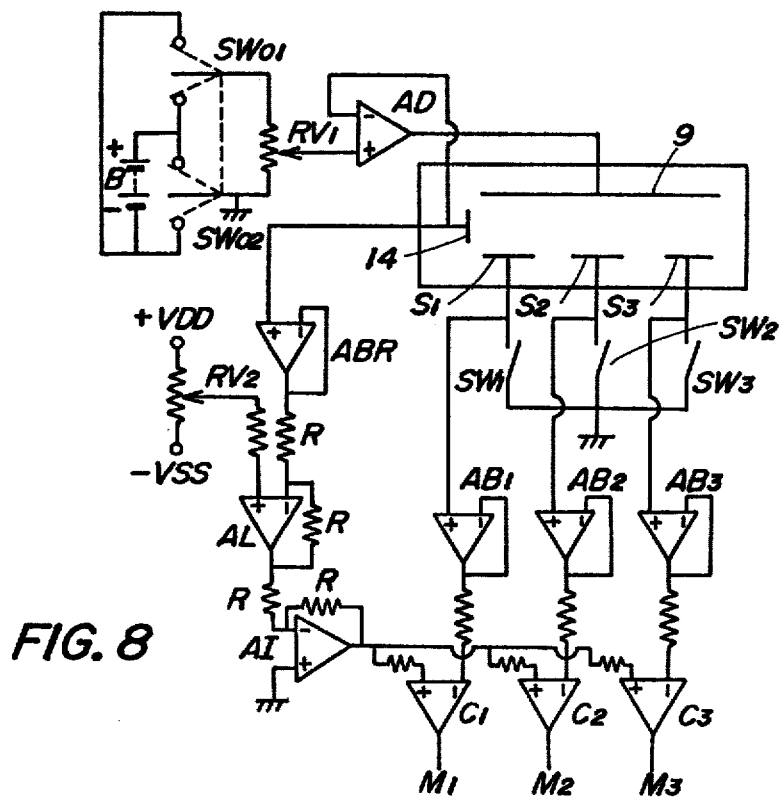
FIG. 8 is a diagram showing a circuit configuration for enabling the segmented ECD with a constant potential and detecting the display state of respective segments of the ECD.

FIG. 6 shows a relationship between degree of coloration and the counter electromotive force indicative of the electric memory state which was measured with the $WO_3$ film of approximately 5000 A thick, while FIG. 7 shows a measuring scheme. In FIG. 6, the numbers on the ordinate indicate the optical density and the numbers on the abscissa indicate the counter electromotive force. In FIG. 7, 15 represents a d.c. voltage meter. The optical density in the bleached state is shown as zero in FIG. 6. At this time the electromotive force is a positive voltage. When the optical density in the colored state shows, for example, 0.7 the counter electromotive force assumes about $-0.4$ V. Since the optical density in the bleached state is supposed to be "zero" as discussed above, there appears to be a considerable difference in the counter electromotive force when in the colored state and in the bleached state for ECDs, that is, 0.4 V. The present invention concerns ECDs having concurrently the electric memory effects and the optical memory effects. A detailed way to detect the electric memory state in the ECD and to drive the ECD will be described with reference to a circuit diagram of FIG. 8. It will be noted that the driver shown in FIG. 4 is called "constant voltage driver," whereas ECD driver and electric memory detector shown in FIG. 8 is called "constant potential driving." In short, the constant potential driving is achieved by a negative feedback loop including the reference electrode 14 and a driving amplifier $A_D$. The switches $SW_{01}$, $SW_{02}$, $SW_1$, $SW_2$ and $SW_3$ are given the same functions as in FIG. 4 except that ECDs can not be held in the memory state even when the switch $SW_{01}$ or $SW_{02}$ is opened.

A variable resistor $R_{V1}$ is provided for adjusting the potential of the reference electrode 14. The output voltage of the driving amplifier $A_D$ and hence the back plate electrode voltage of the ECD varies in such a manner that the potential of the reference electrode is equal to the one determined by the resistor $R_{V1}$. Buffer amplifiers $A_{BR}$, $A_{B1}$, $A_{B2}$ and $A_{B3}$ are adapted to sense the potentials of the reference electrode and the segments $S_1$, $S_2$ and $S_3$, respectively. These buffer amplifiers minimize variations in the counter electromotive force which might be caused by a current flow while measuring the counter electromotive force. An amplifier $A_L$ operates to shift the output level of $A_{BR}$ by varying a resistor $R_{V2}$. An amplifier $A_I$ inverts the output of $A_L$ so that the level-shifted output of the amplifier $A_{BR}$ is provided as the output of $A_I$. Comparators $C_1$, $C_2$ and $C_3$ compare the outputs of $A_{B1}$, $A_{B2}$ and $A_{B3}$ with the output of the amplifier $A_I$. A resistor R determines the gains of the amplifier $A_L$ and $A_I$ which are both $-1$.

The circuit shown in FIG. 8 operates in the following manner. As obvious from FIG. 6, the counter electromotive force is approximately $-0.4$ V when the optical density in the colored state is approximately 0.7.

The resistor $R_{V2}$ of FIG. 8 is, therefore, preset such that the output of the amplifier $A_I$ is about one half of 0.4 V, i.e., 0.2 V smaller than the output of the amplifier $A_{BR}$. If the segment $S_1$ is in the bleached state, the counter electromotive force is approximately zero as can be seen from FIG. 6. At this time the difference between the positive input and the negative input to the comparator $C_1$ is approximately 0.2 V with the positive input side lower than the negative input side. As a result, when the segment $S_1$ is bleached, the output of the comparator $C_1$, i.e., $M_1$ is at a low level.

On the other hand, the segment $S_2$ is in the colored state. Since the counter electromotive force is approximately $-0.4$ V as obvious from FIG. 6, the potential difference between the two inputs to the comparator $C_2$ is approximately 0.2 V with the positive input side higher than the negative one. The output $M_2$ of the comparator $C_2$, therefore, assumes a high level. With the circuit configuration shown in FIG. 8, the colored state and bleached state of the respective segments are electrically represented by the high and low levels of the outputs of the comparators through utilization of their accompanying counter electromotive force and, in other words, the electric memory effects.

Figure 9:
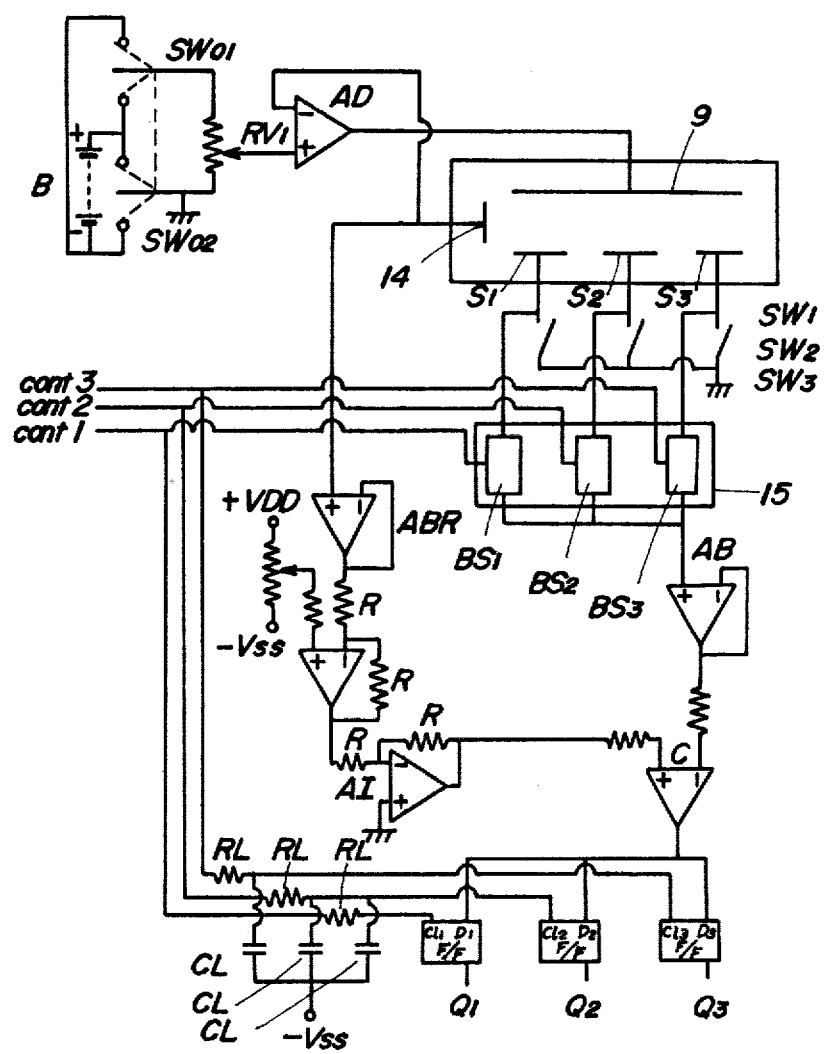
FIG. 9 is a diagram showing a circuit configuration for detecting the display state of the respective segments of the ECD in a time-shared basis.

Although a buffer amplifier and a comparator are provided for respective ones of the segments in the example shown in FIG. 8, it is possible to reduce the number of these components through the use of a di-multiplexer and D-type flip-flops. FIG. 9 shows this approach.

Figure 10:
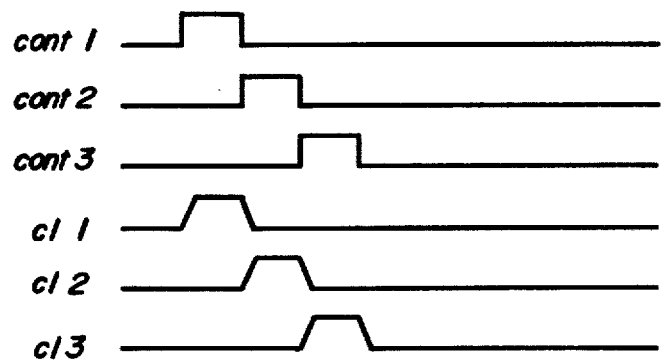
FIG. 10 is a time chart showing control signals helpful in detecting the display state of the respective segments.

It is clear from FIG. 9 that the buffer $A_B$ is the only one connected to the segments $S_1$, $S_2$, and $S_3$ and the segment to be connected to the buffer amplifier $A_B$ is selected by making conductive one of the bidirectional switches $B_{S1}$, $B_{S2}$ and $B_{S3}$ within the di-multiplexer 15. The comparator C is the only one used. The output of the comparator C is stored in three D-type flip flops the outputs of which are labeled $Q_1$, $Q_2$ and $Q_3$. Resistors $R_L$ and capacitors $C_L$ set up at low-pass filter and signals passed through the low-pass filter are applied to clock inputs $cl_1$, $cl_2$, and $cl_3$ of the D-type flip flops. $Cont_1$, $cont_2$ and $cont_3$ are control signals for the bidirectional switches $B_{s1}$, $B_{s2}$, and $B_{s3}$. The switches are turned on when the control signals are at a high level and turned off when they are at a low level. FIG. 10 depicts the relationship between the control signals for the bidirectional switches and the clock signals for the D-type flip flops. The D flip flops send respective output signals $Q_1$, $Q_2$ and $Q_3$ in response to the input states thereof occurring immediately before the clock signals are shifted to a high level.

Mode of operation of the circuit configuration shown in FIG. 9 is carried out as follows. All that is necessary to sense the display state, that is, either the colored state or the bleached state, is to raise Cont 1 to a high level. In other words, when Cont 1 is raised to a high level, the bidirectional switch $B_S1$ is conducting so that the positive input to the buffer amplifier $A_B$ is connected to the segment $S_1$. Then, the output of the comparator C assumes a high level when the segment $S_1$ is colored and assumes a low level when the segment $S_1$ is bleached as in the above discussed example of FIG. 8. $Cont_1$ of a high level is also used as the clock input $Cl_1$ after passing the low pass filter consisting of the resistors $R_L$ and the capacitors $C_L$ so that the output of the comparator C delayed with respect to the trailing edge of Cont 1 is developed at the outputs $Q_1$, $Q_2$, and $Q_3$ of the D flip flops. The low pass filter ensures that the comparator C sends the output thereof to the outputs of the D flip flops because the clock signals $cl_1$, $cl_2$, and $cl_3$ for the D flip flops are delayed with respect to the respective control signals $cont_1$, $cont_2$, and $cont_3$ for the analog switches $B_{s1}$, $B_{s2}$, and $B_{s3}$. The display state of the remaining segments can be carried out in the same manner. A way to employ the buffer amplifier $A_B$ and the comparator C connected to the segments on the time-shared basis is very effective from the viewpoint of simplified circuit construction and cost reduction in case of a large number of segments. In this manner, the electric memory state of the respective segments $S_1$, $S_2$, and $S_3$ is detected on the time-shared basis, whereby determination as to whether the segments are either in the colored state or in the bleached state needs only one comparator.

More detailed attention will be paid to the buffer amplifier. As already explained above, the buffer amplifier is used to minimize and eliminate variations in the electromotive force of the half battery at the reference electrode side or the segment electrode side which might be caused by current flowing through a measuring circuit while measuring the counter electromotive force. However, this implies the following possibility. In other words, the buffer amplifier is not required in the case where the electromotive force is measured over a very short period, not developing variations in the electromotive force, and in the case where the input impedances of the amplifier $A_L$ and the comparator C of FIG. 9 are high enough to disregard variations in the electromotive force, etc.

By way of example, the present invention is applicable to a total distance meter of vehicle. Nowadays, many electronic controls for engines and electronic antiskid controls have been developed in motor vehicles. If such a tendency will be further encouraged, distance meters should be developed utilizing today's sophisticated electronics.

Opto-electric displays such as light emitting diodes and liquid crystal displays have advantageous features, that is, low voltage and low power enabling. However, it is difficult to confirm a visual display provided on light emitting diodes under certain circumstances, for example, when the inside of a vehicle is exposed to the direct sun, because the light emitting diodes are a types of active displays which emit light. On the other hand, liquid crystal displays are passive displays which utilize circumferential light so that they can exhibit satisfactory display functions even under bright circumstances. Also, liquid crystal displays can be illuminated with a lamp in the night. Unfortunately, liquid crystal displays are not superior to ECDs because the former do not show any electric memory effects.

Figure 11:
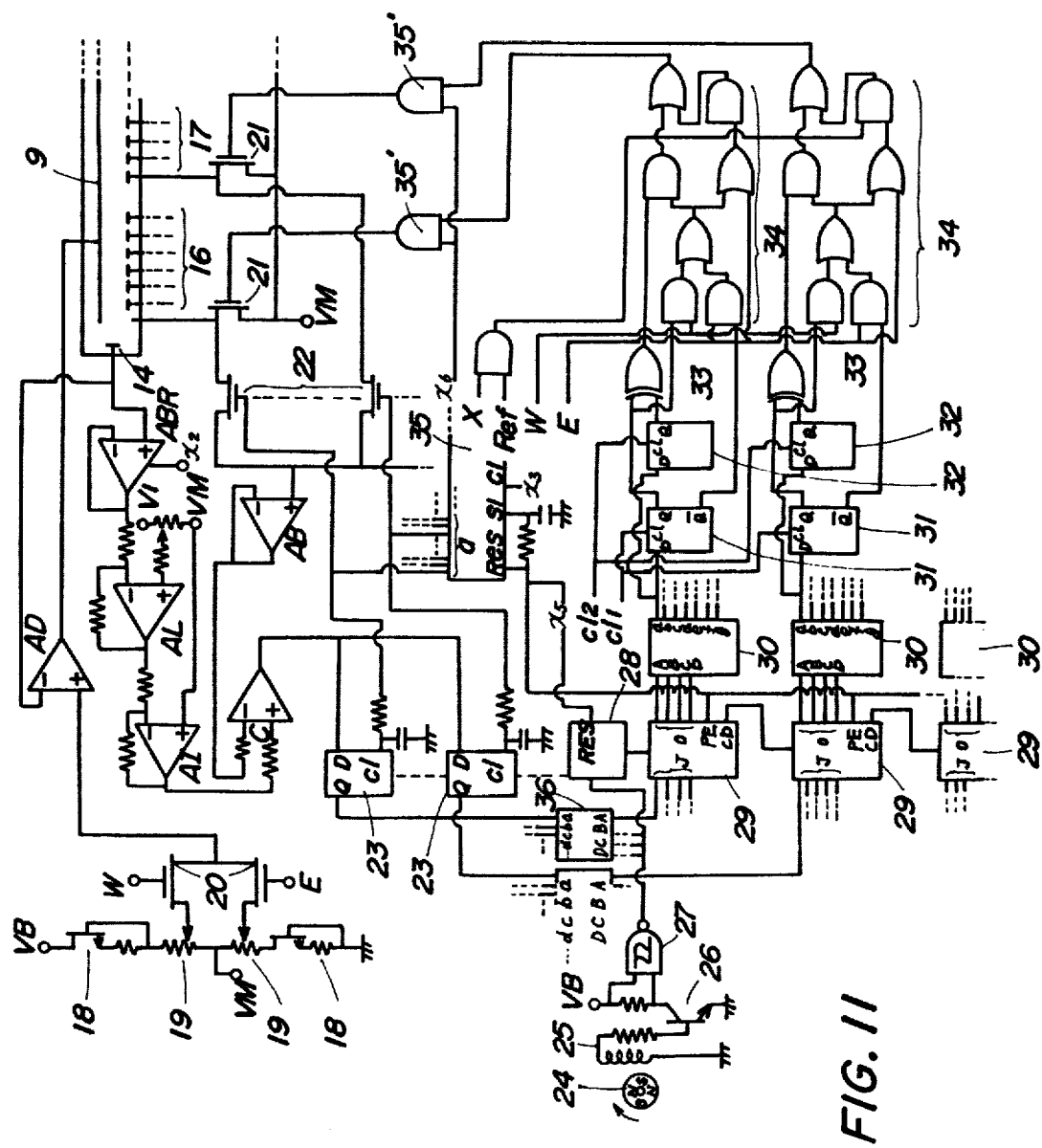
FIG. 11 is a circuit diagram of an example of application of the present invention to an ECD accumulator/driver.

In FIG. 11, there is shown an accumulating and counting distance scheme for use in motor vehicles incorporating an ECD pursuant to the present invention. With respect to the distance meter shown a in FIG. 11, FIG. 12 shows construction of a signal generator used with the distance meter and FIG. 13 shows a time chart of various signals which occurs within the generator of FIG. 12.

Figure 14:
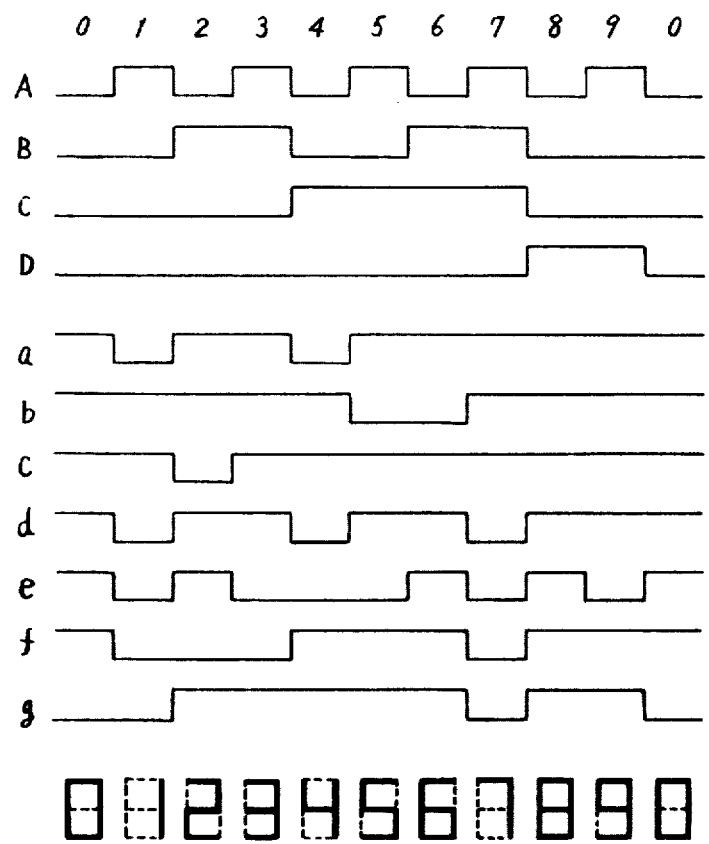
FIG. 14 is a time chart with respect to an alphanumerical seven-segmented display pattern.

Two families of segments 16 and 17 of the ECD are illustrated for displaying traveled distance. When it is desired to display the distance a vehicle is driven within the range of 100 m through 100,000 Km, such families of segments, that is, seven digits as shown in FIG. 3 are required. Bidirectional switches 21 each consist of an enhancement type FET with one of the terminals of the respective switches 21 connected commonly to an intermediate voltage source $V_M$. Enhancement type FETs 22 set up a dimultiplexer which is adapted to connect the respective ones of the segment electrodes to the buffer amplifier $A_B$ on a time-shared basis, with the gates thereof controlled by parallel outputs of a shift register 35. D flip flop 23 stores the output of the comparator C for the respective ones of the segment electrodes. Encoders 36 are provided to convert seven segment signals such as those corresponding to the fort shown in FIG. 3 into binary signals with the number thereof corresponding to the number of maximum digits to be displayed. A permanent magnet 24 rotatable with the rotation of a propeller shaft and a fixed coil 25 for sensing the rotation of that magnet 24, in combination, convert traveling of the vehicle into electric signals. An amplifier 26 amplifies the small voltage induced in the coil 25. A NAND/Schmitt trigger 27 shapes the output of the amplifier 26. A frequency divider 28 divides the pulses derived from the trigger 27 and, when the least significant digit of the display is selected to be on the order of 100 m, sends signals from a presettable decade counter 29, which provides the output signals thereof in binary notation. The decade counter 29 has a carry out terminal CO of which the potential R changes from a low level to a high level when the output O changes "9" to "0" in decimal notation. Since the terminal Co is connected to an input terminal of the next succeeding stage, a multi-digit display is possible by a cascade connection of a plurality of the decade counters 29. A decoder 30 is adapted to convert the binary coded output of the decade counter 29 into the seven segment signals corresponding to a fort such as shown in FIG. 3. For the encoder 36 and the decoder 30, A, B, C and D represent the binary coded signals and a, b, c, d, e, f and g represent the seven segment signals. The correspondence therebetween is shown in FIG. 14.

D flip flops 31 and 32 store the output of the decoder 30 under control of clock signals $cl_1$ and $cl_2$. Upon the leading edge of the clock signals, the D flip flops receive the input signals when the just preceding clock signal is at a low level and upon the trailing edge they transmit the same to the outputs Q. It is obvious from FIG. 13 that the leading edge of the clock signal $cl_1$ preceeds a very short period of time the counterpart of $cl_2$. The input to the D flip flop 32 is the input to the D flip flop 31. The D flip flop 32, therefore, stores the signal of the D flip flop 31 which has been developed before the coming clock signals. The output a of the decoder 30 is developed at the D flip flop 31 so that the output of an exclusive OR gate 33 receiving the two outputs from the D flip flop 31 and 32 is increased to a high level when the output a of the decoder 30 is varied from a low level to a high level and vice versa. A control circuit 34 controls the bidirectional switch 21 which in turn turns the display segments 16 and 17 on and off. The control circuit 34 in cooperation with the exclusive OR gate 33 turns on the bidirectional switch 21 via a coloring or write signal W when the output a of the decoder 30 changes from a low level to a high level, and turns off the bidirectional switch 21 via a bleaching or erase signal E when the output a changes from a high level to a low level. Refresh signals Ref are generated to restore display quality under control of a signal X via an AND gate. Providing that signal X is at a high level, the refresh signals REF permit both signals E and W to pass when the output a is at a high level and only the signal E to pass through control circuit 34 when the output a is at a low level, thereby restoring the colored state and the bleached state. A monostable multivibrator triggered by a manual key or an engine key in an automobile can be used to place the signal X at a high level. $V_B$ represents a battery source in the automobile. $V_M$ is an intermediate voltage source which is one half of $V_B$. Junction type FETs 18 having the constant current properly set up a constant voltage source together with resistors 19. FETs 20 transfer a coloring voltage and a bleaching voltage established by the resistors 19 into a driving amplifier $A_D$ under control of the signals W and E applied to the respective gates thereof. When the signal W is at a high level, a voltage positive with respect to the intermediate voltage $V_M$ is applied to a positive input to the driving amplifier $A_D$, thereby coloring the segment connected to the bidirectional switch 21 which is in the on state is synchronization with the signal W. If the signal E is at a high level, a voltage negative with respect to the intermediate voltage $V_M$ is applied to the positive input to the amplifier $A_D$, thereby bleaching the segment connected to the bidirectional switch 21 which is conducting in synchronization with the signal E.

Figure 12:
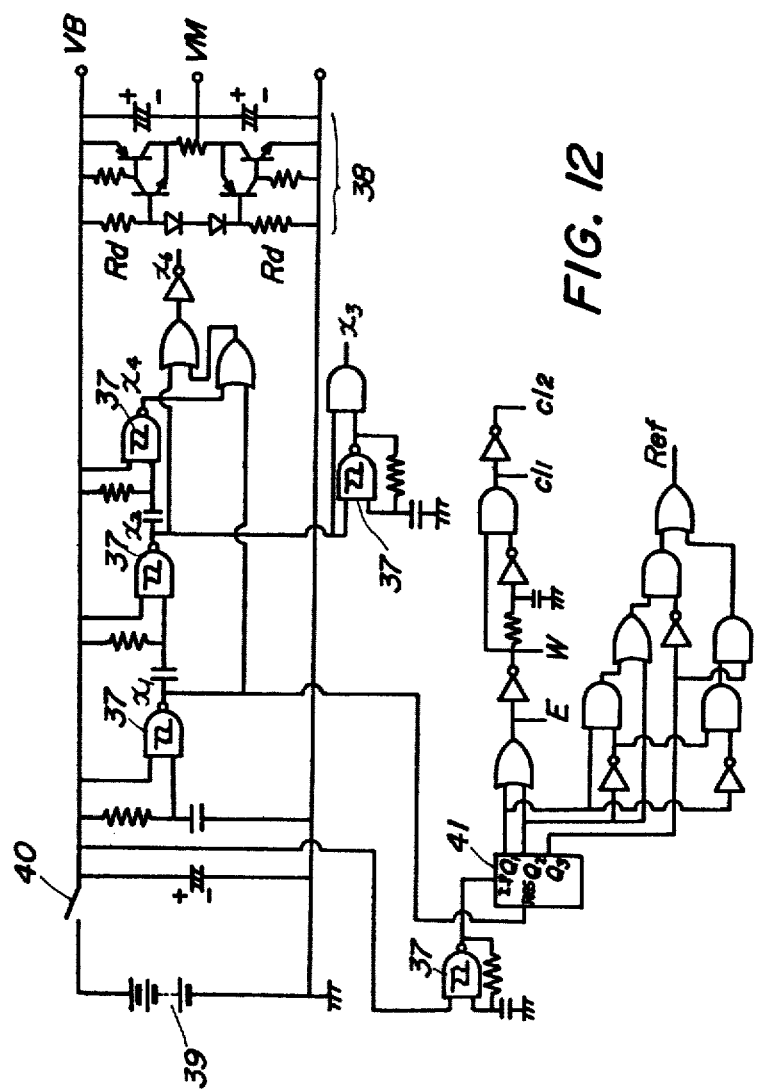
FIG. 12 is a circuit diagram of a signal generator demanded by the circuit configuration shown in FIG. 11.
Figure 13:
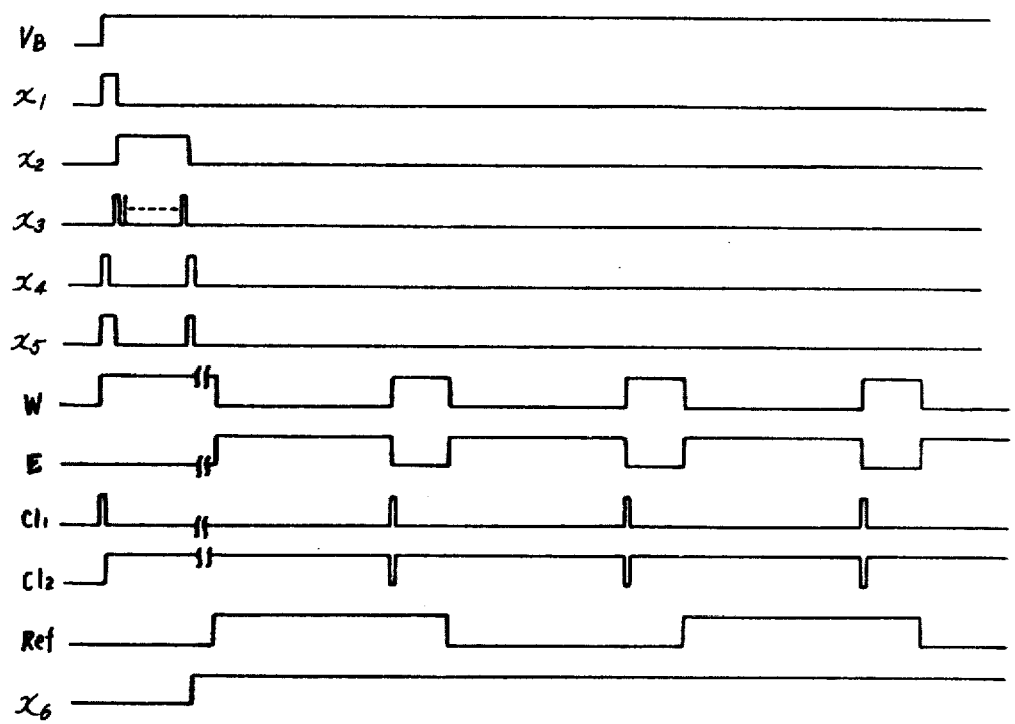
FIG. 13 is a time chart of various signals occurring in the circuit of FIG. 12.

Referring to FIG. 12, a switch 40 associated with an engine key for example leads a vehicle loaded battery 39 to the signal generator shown in FIG. 12 upon throw of the engine key. At this time the battery voltage is $V_B$. The NAND/Schmitt trigger is labeled 37. A circuit 38 is provided to derive the intermediate $V_M$ ($V_M = \frac{1}{2} \cdot V_B$) through resistors $R_D$. A binary counter 41 effects the counting function in response to the trailing edge of a signal applied to an input terminal I.P. An output terminal $Q_1$ provide pulses and an output terminal $Q_2$ provides pulses of which the frequency is one half that from the output terminal $Q_1$ and an output terminal $Q_3$ provides pulses of which the frequency is one half that from the output terminal $Q_2$.

FIG. 13 is a time chart of various signals occurring within the generator shown in FIG. 12. W and E are the above discussed coloring and bleaching signals and $Cl_1$ and $Cl_2$ are the clock pulses of the D flip flops shown in FIG. 11 of which the pulse width is identical with that of the signals W and E. The contents of the display on the ECD are varied from pulse width to pulse width. For example, when the vehicle is running at 100 km/h, that is, approximately 28 m for a second, the pulse width of these pulses may be one through four seconds for practical use because the least significant scale is 100 m in the given example. In FIG. 13, a ratio of the pulse width of the write signal W to that of the erase signal E is 1:3 so that when the one cycle is selected four seconds the write signal W lasts for a second and the erase signal E lasts for three seconds. Though these periods are relied upon the given coloring and bleaching voltages too, they should be long enough to complete the coloring and bleaching. The leading edge of the refresh pulses Ref coincides with the leading edge of the erase signal E and the trailing edge thereof coincides with the trailing edge of the write signal. This is because that, if the display quality is reduced for example due to fading, that segment should be bleached wholly and thereafter colored. The signal X disclosed with respect to FIG. 11 should be placed at a high level or a low level when the refresh signals Ref are at a low level. If this procedure is carried out when the refresh signals Ref are at a high level, the coloring and bleaching after the refresh process might not come about with satisfactory results.

Referring to FIGS. 11 through 13, the advantageous features of the present invention will be described. When a driver leaves an automobile, an engine key is normally cut off and a battery also is cut off. As a result all voltage supplies are cut. However, in the case where the total travel distance meter is electronically controlled, the total travel distance should be memorized via the ECD even when all of the voltage supplies are cut off. As noted earlier, the ECD manifests optical memory effects and electric memory effects even when the power supply is off, without necessitating any particular memory elements. When the operator gets back the automobile, the engine key is operated and concurrently the contents of th ECD are electrically read out. Read out of the ECD is loaded as the initial value into a counter for counting a total travel distance.

Thereafter, the power switch 40 of FIG. 12 is turned on to supply the circuit of FIG. 12 with voltage. Then, the three monostable multivibrators consisting of the resistors, the capacitors and the NAND/Schmitt triggers 37 operate in sequence. A signal $X_1$ is increased to a high level, which identical with a signal $X_5$, and places the shift register 35 into the reset state such that all of the parallel outputs a thereof are forced at a low level. The monostable multivibrator at the next succeeding state starts operating at the trailing edge of the signal $X_1$ with an accompanying output signal $X_2$ at a high level. The signal $X_2$ controls the oscillation of a free running multivibrator and, when the signal X is at a high level, the free running multivibrator keeps on oscillating. The output of the free running multivibrator is $X_3$ which is a clock signal for the shift register 35. The serial inputs S1 of the shift register 35 which has been reset by the signal $X_1$, receive signals delayed via the resistor/capacitor combination. It is, therefore, possible to apply the first clock pulse to the signal $X_3$ while S1 is still at a high level. In response to the leading edge of the first clock pulse the shift register 35 accepts the high level signals S1. The delay time of the signal $X_1$ applied to S1 is determined such that S1 is reduced to a low level prior to the leading edge of the second pulse of the signals $X_3$. This permits only one of the parallel outputs a of the shift register 35 to assume a high level. That position where the output is at a high level is sequentially shifted in response to the leading edges of the next succeeding clock signals. Because the outputs a of the shift register 35 are connected to the respective gates of FETs 22 and the delayed outputs of the shift register 35 are applied as clock signals to the D flip flops, the D flip flops 23 receive and store the display contents of the respective segments as the position where the output of the shift register 35 is at a high level. This means that the number of the pulses $X_3$ while the signal $X_2$ is at a high level should be greater than the number of all of the segments. The signals stored in the D flip-flops 23 are changed into the corresponding binary coded signals via the encoder 36 and applied to a jam input J of the decade counter 29. The trailing edge of the signal $X_2$ renders the last stage monostable multivibrator operable with the output $X_4$ thereof at a high level. The signal $X_4$ passed through an OR gate is called the signal $X_5$, which is a reset signal for the shift register 35 and a present signal PE for the decade counter 29. When the signal PE is at a high level, the contents of jam input J is loaded into the decade counter 29. When the signal $X_4$ is at a high level following the trailing edge of the signal $X_2$, the display contents of the ECD are loaded as the initial value into the decade counter 29. While the shift register 35 is reset at this time, the contents of the D flip flop 23 are not changed. The signal $X_6$ is the output of a logical NOR of the three signals $X_1$, $X_2$ and $X_4$. As long as the signal is at a low level, the output of the gate 35 is at a low level and the bidirectional switch 21 is not turned on. This signal ensures that the display contents of the ECD never vary until the display contents of the ECD are loaded as the initial value into the decade counter 29 after power throw. In this manner, the display contents of the ECD are introduced as the initial value into the decade counter 29.

As already described, the signal $X_5$ is the reset signal for the frequency divider 28 and the frequency divider 28 is ready for accumulation and display of total distance when the decade counter 29 is loaded with the initial value. It needs at most a second. At a point in time where at least two clock signals $Cl_1$ are applied after that preparation procedure, the circuit of FIG. 11 is about to start operating.

For example, as the vehicle is driven the permanent magnet 24 is rotated so that the frequency divider 28 sends the first stage of the decade counter 29 a pulse at every least significant distance unit (e.g. 100 m), thereby accumulating traveled distance on the initial value. The output of the decade counter 29 is converted into the seven segment signals via the decoder 30. These seven segment signals are read into the D flip flops 31 and 32 at each period of the clock signals $Cl_1$ and $Cl_2$. Therefore, when the display states of the respective segments are to be changed to the colored state or the bleached state, the bidirectional switch 21 is correspondingly turned on in synchronization with the write signal W or the erase signal E, thereby varying the display contents of the ECD.

Figure 15:
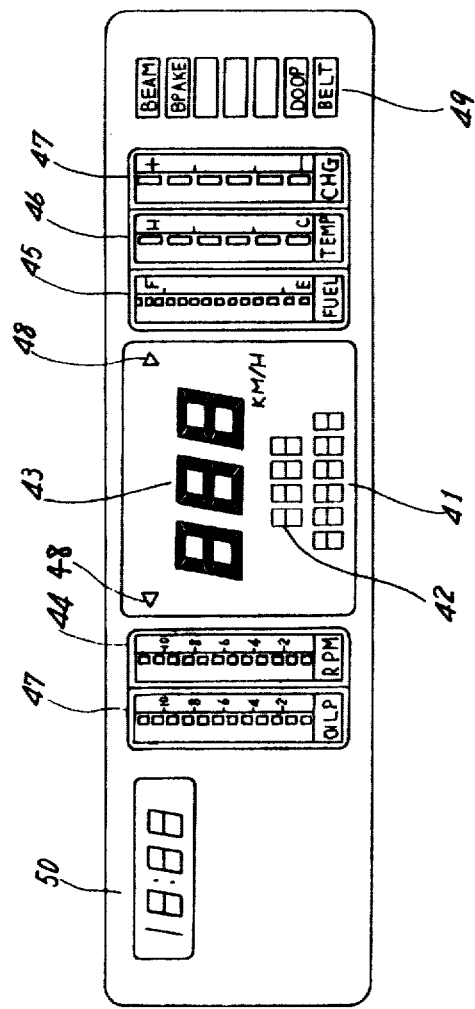
FIG. 15 is a plan view of an ECD incorporated dashboard panel for a vehicle.

FIG. 15 shows a dashboard panel provided with the vehicle distance accumulator/display of the present invention. The ECD is applicable, in addition to the above described distance accumulator/display, to a trip meter 42, a speed meter 43, an engine revolution meter (tachometer) 44, a fuel meter 45, a heat indicator (thermometer) 46, an oil pressure gauge 47, an amperemeter 47, direction indicators 48, a variety of alarms 49 such as a head lamp indicator, a lamp failure indicator, a door lock alarm, seat belt lock alarm, a parking brake alarm, a battery level alarm, a catalyst overheat alarm, a clock 50, a radio indicator, etc. Therefore, a large number of indicators and alarms implemented with the ECD material can be incorporated onto a single panel.

Figure 16:
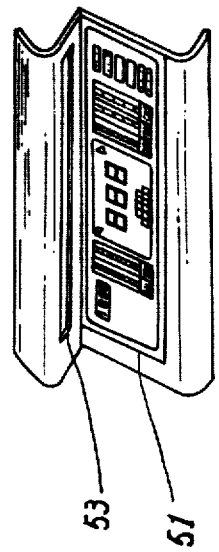
FIG. 16 is a perspective view of a lamp illuminated dashboard.
Figure 17:
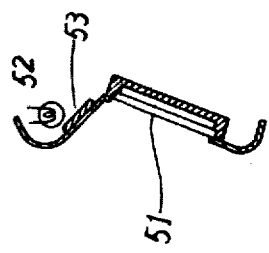
FIG. 17 is a cross sectional view of the dashboard shown in FIG. 16.

FIGS. 16 and 17 show a lamp illuminated dashboard. Because ECDs are passive displays, they need a source of auxiliary light in the night or within tunnels. The dashboard 51 provided with the ECD is illuminated effectively via a light diffuser 53 with an auxiliary lamp 52 without disturbing the the driver's field of view.

While only certain embodiments of the present invention have been described, it will be apparent to those skilled in the art that various changes and modifications may be made therein without departing from the spirit and scope of the invention as claimed.

We claim:

1. A driver circuit means for driving an electrochromic display including a plurality of segment electrodes and a reference electrode and an electrochromic material interposed therebetween, said segment electrodes being capable of being colored or bleached, the electrodes developing counter electromotive forces thereon, the said counter electromotive forces on said segment electrodes being characteristic of the colored or bleached state thereof, and the said counter electromotive forces developed between the surface of the electrochromic material and the respective surfaces of said electrodes, said driver circuit means comprising:

first determining means associated with each of said segment electrodes for determining the counter electromotive force developed at each of the segment electrodes and for developing a respective plurality of output signals representative thereof;

means for developing a predetermined sequence of control signals;

a plurality of bidirectional switch means responsive in said predetermined sequence to said control signals for interconnecting said segment electrodes in said predetermined sequence with said first determining means to provide a said predetermined sequence of output signals representative, respectively, of the states of said segment electrodes;

second determining means for determining the counter electromotive force developed at said reference electrode and developing output signals in accordance therewith; and state signal generation means responsive to said output signals from said first and second determining means for providing a said predetermined sequence of state signals indicative, respectively, of whether said segment electrodes are in the colored state or the bleached state.

2. Driver circuit means in accordance with claim 1 wherein said state signal generation means comprises a single comparator means responsive in said predetermined sequence to said output signals from said first and second determining means.

3. The driver circuit menas in accordance with claim 2 wherein said first determining means comprises amplifier means interposed between said plurality of bidirectional switch means and said comparator means for sensing the potential at each of said electrodes indicative of said counter electromotive forces developed thereon and developing said respective plurality of output signals representative thereof in accordance with said potential.

* * * * *